(12) United States Patent
Kim

(10) Patent No.: US 7,851,317 B2
(45) Date of Patent: Dec. 14, 2010

(54) METHOD FOR FABRICATING HIGH VOLTAGE DRIFT IN SEMICONDUCTOR DEVICE

(75) Inventor: Jea-Hee Kim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 263 days.

(21) Appl. No.: 12/125,086

(22) Filed: May 22, 2008

(65) Prior Publication Data

US 2008/0296678 A1    Dec. 4, 2008

(30) Foreign Application Priority Data

May 29, 2007    (KR) .................... 10-2007-0052058

(51) Int. Cl.
*H01L 21/336*    (2006.01)
(52) U.S. Cl. .................... 438/306; 438/369; 438/372; 438/390
(58) Field of Classification Search ................ 438/306, 438/369, 372, 390
See application file for complete search history.

(56) References Cited

U.S. PATENT DOCUMENTS 5,844,275 A    12/1998    Kitamura et al.
6,306,711 B1 *    10/2001    Yang ........................ 438/286
6,878,603 B2    4/2005    Bromberger et al.
6,900,520 B2 *    5/2005    Lee ........................... 257/603
2008/0032445 A1 *    2/2008    Lee et al. .................... 438/104

FOREIGN PATENT DOCUMENTS

| CN | 2879425 | 3/2007 |
|---|---|---|
| JP | 2006-173357 | 6/2006 |
| KR | 10-2005-0046054 | 5/2005 |

\* cited by examiner

*Primary Examiner*—Thien F Tran
(74) *Attorney, Agent, or Firm*—Sherr & Vaughn, PLLC

(57) ABSTRACT

A drift of a high voltage transistor formed using an STI (shallow trench isolation). The method for forming a high voltage drift of a semiconductor device can include forming a pad insulating film on a semiconductor substrate having a high voltage well; and then opening a region of the semiconductor substrate by patterning a portion of the pad insulating film; and then etching the opened region of the semiconductor substrate to form a trench; and then forming a first drift in the semiconductor substrate by performing a first ion implantation process using the patterned pad insulating film as a mask; and then forming a device isolation film by gap-filling a device isolation material in the trench; and then removing the patterned pad insulating film and then forming a gate electrode overlapping a portion of the device isolation film; and then forming a second drift connected to the first drift by performing a second ion implantation process in a region of the semiconductor substrate exposed by the gate electrode.

15 Claims, 5 Drawing Sheets

METHOD FOR FABRICATING HIGH VOLTAGE DRIFT IN SEMICONDUCTOR DEVICE

The present application claims priority under 35 U.S.C. 119 and 35 U.S.C. 365 to Korean Patent Application No. 10-2007-0052058 (filed on May 29, 2007), which is hereby incorporated by reference in its entirety.

BACKGROUND

A semiconductor integrated circuit may have a high voltage control device to which a high voltage is directly applied in order to directly control an external system that uses a high voltage. Such a high voltage control device may be needed in a circuit that requires a high breakdown voltage.

A CMOS device with small power consumption may generally be widely used as a high voltage control device. The CMOS device may include a PMOS (P-type MOS) transistor and an NMOS(N-type MOS) transistor. Each transistor may have a double diffused drain structure having the same conductive type lightly-doped region as a source and a drain formed at a lower part of the source and drain regions to obtain a high breakdown voltage.

In an MOSFET device having such a double diffused drain structure, a high voltage may be applied to a gate electrode and a drain region. Thereupon, a high electric field may be formed between the gate electrode and a substrate or between the drain region and the substrate. Meaning, as a high electric field is formed in a region adjacent to the drain region and the gate electrode, a problem that the breakdown voltage decreases arises.

Accordingly, a MOSFET device having an offset-LOCOS (Local Oxidation of Silicon) structure has been proposed in order to prevent decrease in breakdown voltage that arises in a MOSFET device having a double diffused drain structure.

Figure 1:
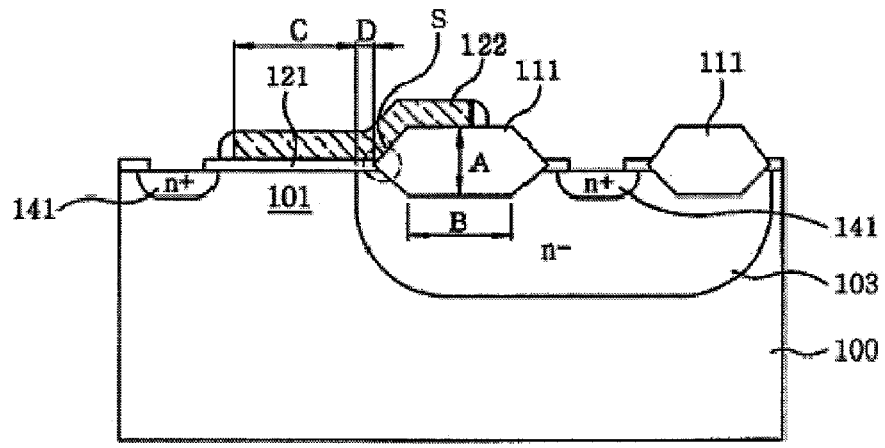

Example FIG. 1 illustrates a cross sectional view of a MOSFET having a LOCOS structure and may include Referring to FIG. 1 an MOSFET device having an offset-LOCOS structure according to the conventional art includes $n^+$ source/drain regions 141 spaced apart from each other in a predetermined region in $P^-$type semiconductor substrate 100. Source/drain region 141 is disposed in an $n^-$ extended drain region acting as a drift region, for example, $n^-$ drift region 103. Also formed in a surface of substrate 100 between $n^+$ source/drain region 141 and $n^-$ drift region 103 is channel forming region 101. Gate electrodes, i.e., gate insulating film pattern 121 and gate conductive film pattern 122 are sequentially disposed on and/or over channel forming region 101. $N^+$ source/drain regions 141 are electrically connected to source electrode S and drain electrode D. As a device isolation film of such an MOSFET device, LOCOS device isolation film 111 is used.

LOCOS device isolation film 111 plays a role of increasing the thickness of both sides of gate insulating film pattern 121. By this, a high electric field applied to both sides of gate insulating film pattern 121 is distributed to both sides of gate insulating film pattern 121 at the time of device isolation, thus relieving stress caused by the electric field in these regions. As the thickness of gate insulating film pattern 121 increases, the electric stress caused by the electric field decreases.

Characteristics of the above MOSFET formed by a LOCOS process are determined by the thickness A of LOCOS device isolation film 111, the size B of a channel operating at a high voltage, the size C of channel forming region 101 operating in a low voltage region, and the size D from the starting point of n–drift region 103 to the bird's beak S of LOCOS device isolation film 111. To adjust the sizes B, C, and D, the size and thickness A of LOCOS device isolation film 111 function as the largest variable, however, there is a problem that it is generally difficult to adjust the size and thickness A of device isolation film 111 formed by the LOCOS method. In other words, since it is difficult to control the bird's beak S portion of device isolation film 111 by the process condition, it is impossible to adjust the thickness A of device isolation film 111. Therefore, there is a problem that the characteristics of the MOSFET become worse because the sizes B, C, and D are arbitrarily changed due to the size of the bird's beak S. That is, if the size D becomes larger due to the bird's beak S, a single channel can be formed in conjunction with C, and if the size D becomes smaller, a well breakdown voltage may be a problem. Additionally, because $n^-$ drift region 103 is formed within semiconductor substrate 100 below device isolation film 111, the size and doping concentration of n– drift region 103 become irregular due to the unevenness of the thickness A of device isolation film 111, thereby deteriorating the characteristics of the MOSFET.

SUMMARY

Embodiments relate to a method for forming a high voltage drift of a semiconductor device, which can adjust the size of a channel operating at a high voltage, the size of a channel region operating in a low voltage region, and the size from the starting point of a drift region to the bird's beak of a device isolation film because a device isolation film of a desired size can be formed by forming an STI-type device isolation film in a high voltage transistor region of a semiconductor substrate.

Embodiments relate to a method for forming a high voltage drift of a semiconductor device, which can form a device isolation film of a desired size by device-isolating a high voltage transistor region from other regions and forming a drift in the high voltage transistor region by carrying out an STI process two times at the time of formation of a device isolation film of a semiconductor substrate having a high voltage transistor region and other regions.

Embodiments relate to a method for forming a high voltage drift of a semiconductor device which can include at least one of the following steps: forming a pad insulating film on and/or over a semiconductor substrate having a high voltage well; and then opening a region of the semiconductor substrate by patterning a portion of the pad insulating film; and then etching the opened region of the semiconductor substrate and then forming a trench; and then forming a first drift on and/or over the semiconductor substrate having the trench formed thereon by carrying out a first ion implantation process using the patterned pad insulating film as a mask; and the forming a device isolation film by gap-filling a device isolation material in the trench; and then removing the patterned pad insulating film and then forming a gate electrode so as to be overlapped with a part of the device isolation film; and forming a second drift connected to the first drift by carrying out a second ion implantation process onto a partial region of the semiconductor substrate exposed by the gate electrode.

In accordance with embodiments, the first and second ion implantation processes can preferably be performed under the same process condition, and the trench is formed by isotropic etching. The depth of the trench can be determined depending on a driving voltage of the semiconductor substrate.

Embodiments relate to a method for forming high voltage drift of a semiconductor device which can include at least one of the following steps: forming a pad insulating film on and/or over a semiconductor substrate having a high voltage transistor region; and then opening a region of the semiconductor substrate by patterning a portion of the pad insulating film; and then etching the opened region of the semiconductor substrate and then forming a first trench; and then forming a first drift on the semiconductor substrate having the trench formed thereon by carrying out a first ion implantation process using the patterned pad insulating film as a mask; and then forming a second trench by etching a part of the semiconductor substrate having the first trench in order to separate the high voltage transistor region and a logic region; and then forming first and second device isolation films by gap-filling a device isolation material in the first and second trenches; and then removing the patterned pad insulating film and then forming a gate electrode so as to be overlapped with a part of the first device isolation film; and then forming a second drift connected to the first drift by carrying out a second ion implantation process onto a partial region of the semiconductor substrate exposed by the gate electrode.

In accordance with embodiments, the first and second ion implantation processes can be performed under the same process condition, the first trench is formed by an isotropic etching process, and the depth thereof is determined depending on a driving voltage of the high voltage transistor. The second trench can be formed by an anisotropic etching process.

DRAWINGS

Example FIG. 1 illustrates a MOSFET having a LOCOS structure.

Example FIGS. 2A to 2E illustrate a process for forming a drift of a high voltage transistor, in accordance with embodiments.

Example FIGS. 3A to 3H illustrate a process for forming a drift of a semiconductor device including a logic region, in accordance with embodiments.

DESCRIPTION

Figure 2A:
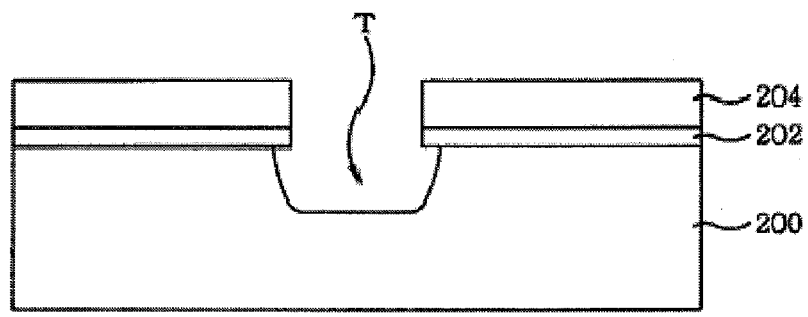

As illustrated in example FIG. 2A, pad insulating film 202 is formed on and/or over semiconductor substrate 200. Pad insulating film 202 can be formed by using SiN. Photoresist pattern 204 can then be formed on and/or over pad insulating film 202. A P-well region or an N-well region for a high voltage can be formed in semiconductor substrate 200. A portion of pad insulating film 202 may be opening in a predetermined region, i.e., an STI forming region, of substrate 200.

Here, a well formation process for a high voltage will be described. A well for a high voltage is formed in semiconductor substrate 200 by performing an ion implantation process using a well mask, and then carrying out annealing. Next, the predetermined region of semiconductor substrate 200, i.e., the STI forming region, can be exposed by etching pad insulating film 202 exposed by photoresist pattern 204. A portion of semiconductor substrate 200 is isotropically etched by a chemical dry etching process, thereby forming trench T. The thickness of the trench T, i.e., the depth of semiconductor substrate 200 etched to form trench T, can be determined depending on a driving voltage of the high voltage transistor.

Figure 2B:
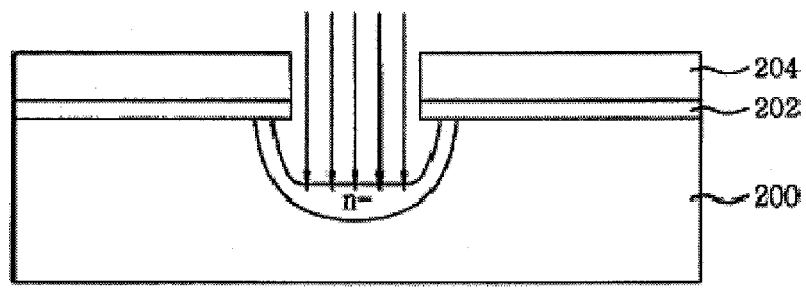

As illustrated in example FIG. 2B, to form a drift region, a first ion implantation process can then be carried out on the resultant structure to form a portion of $n^-$ drift 206 in trench T within semiconductor substrate 200. Etched pad insulating film 202 and photoresist pattern 204 can be used as a first ion implantation process mask. A strip process can then be carried out to remove photoresist pattern 204.

Figure 2C:
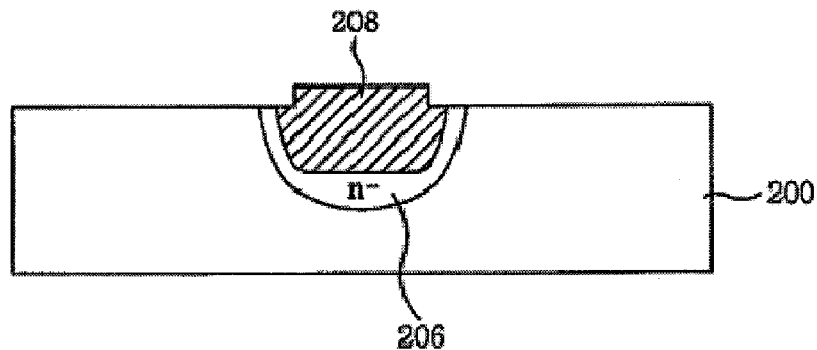

As illustrated in example FIG. 2C, device isolation film 208 can then be formed on and/or over n–drift 206 by depositing a device isolation insulating film so as to completely bury trench T and then carrying out a planarization process in which the pad insulating film 202 is used as a polishing start point. Device isolation insulating film 208 can be formed of $O_3$ TEOS film. The planarization process can be a CMP (chemical mechanical polishing) process. Pad insulating film 202 can then be removed by carrying out a wet etching process, such as by using phosphoric acid ($H_3PO_4$).

Figure 2D:
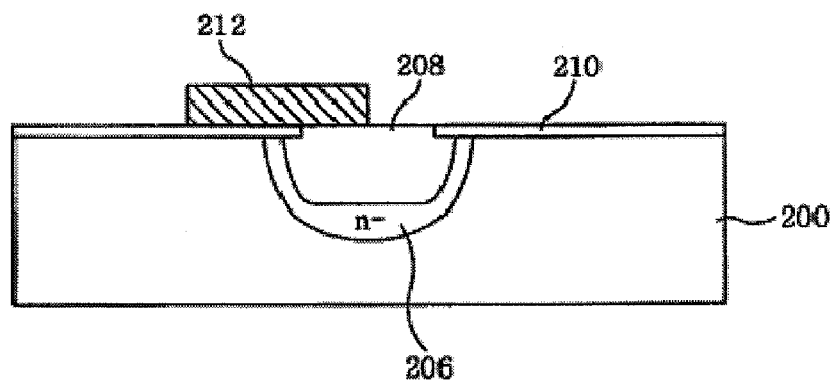

As illustrated in example FIG. 2D, gate insulating film 210 can then be formed on and/or over semiconductor substrate 200 by an oxidation process such as one of dry oxidation and wet oxidation. A conductive film for a gate electrode can then be formed on and/or over gate insulating film 210. The conductive film for the gate electrode can be formed of an undoped or doped polysilicon film. The undoped silicon film can be formed by using $SiH_4$ or $Si_2H_6$ by an LPCVD method. The doped silicon film can be formed by using $SiH_4$ and $PH_3$ or $Si_2H_6$ and $PH_3$ by an LPCVD method. Continually, a photoresist pattern can be formed on and/or the conductive film by carrying out a mask process for defining a gate electrode. Gate electrode 122 can then be formed by etching the conductive film by carrying out an RIE (reactive ion etching) process. Gate electrode 212 can be formed so as to be overlapped a portion of device isolation film 208 and a portion of gate insulating film 210.

Figure 2E:
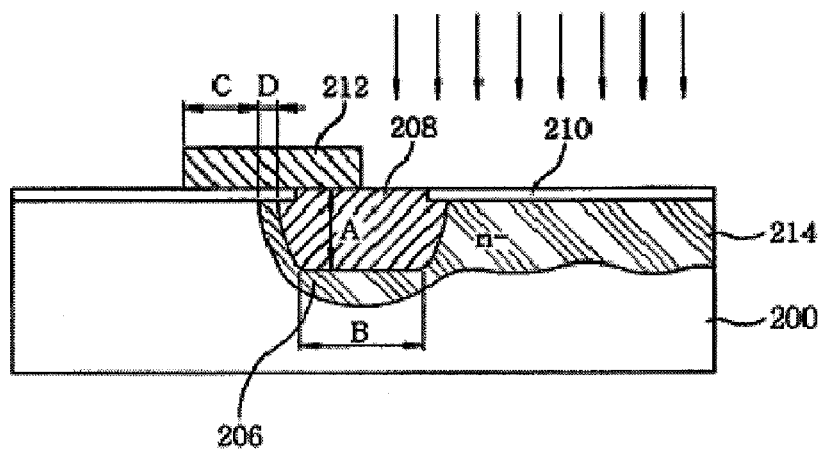

As illustrated in example FIG. 2E, the photoresist pattern can then be removed by a strip process, and then a second ion implantation process can be carried out onto a region which is opened by gate electrode 212 and includes device isolation film 208, thereby forming second $n^-$ drift 214 connected to first $n^-$ drift 206 and completing the drift. In accordance with embodiments, the second ion implantation process, no ions are implanted into semiconductor substrate 200 below device isolation film 208. The first and second ion implantation processes can preferably be carried out under the same process condition.

An application of the above-described drift formation process in accordance with embodiments to a semiconductor device including a logic region will be described below.

Figure 3A:
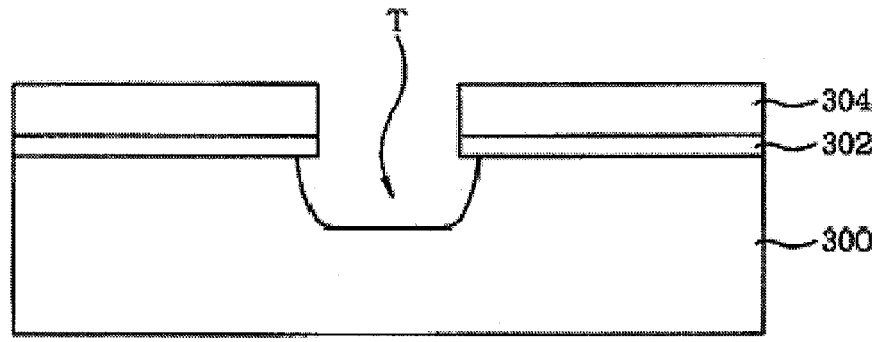

As illustrated in example FIG. 3A, pad insulating film 302 can be formed on and/or over semiconductor substrate 300. Pad insulating film 302 can be formed using SiN. Photoresist pattern 304 can then be formed in which a partial region of pad insulating film 302, i.e., an STI forming region, is opened. A p-well region or an n-well region for a high voltage can be formed in semiconductor substrate 300.

A well formation process for a high voltage will be described. A well for a high voltage can be formed in semiconductor substrate 300 by performing an ion implantation process using a well mask, and then carrying out an annealing process. A predetermined region of semiconductor substrate 300, i.e., an STI forming region, can then be exposed by etching pad insulating film 302 exposed by photoresist pattern 304. The predetermined region of semiconductor substrate 300 can then be isotropically etched by a chemical dry etching process, thereby forming first trench T1. The thickness of first trench T1, i.e., the depth of semiconductor substrate 300 etched to form the first trench T1, can be determined depending on a driving voltage of the high voltage transistor.

Figure 3B:
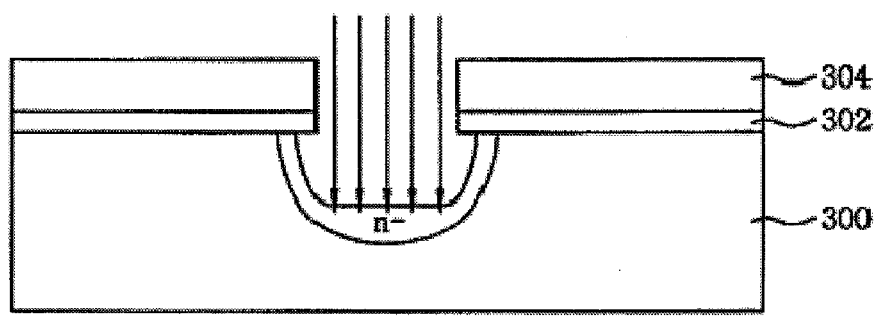

As illustrated in example FIG. 3B, a first ion implantation process can then be carried out on the resultant structure to form first $n^-$ drift 306 in first trench T1 in semiconductor substrate 300. Etched pad insulating film 302 and photoresist pattern 304 can be used as a first ion implantation process mask. A strip process can then be carried out to remove photoresist pattern 304.

Figure 3C:
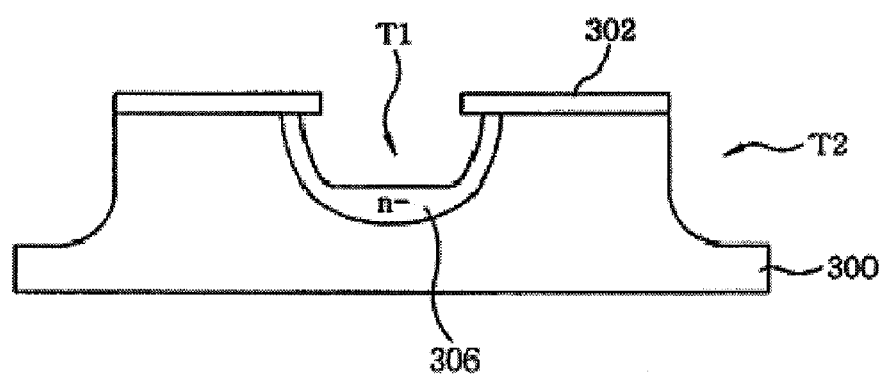

As illustrated in example FIG. 3C, etched pad insulating film 302 can then be patterned by a PEP (photo etching process) for forming second trenches T2 to thus, open a portion of semiconductor substrate 300 in order to form a device-isolate a logic region (or other regions for other functions, for example, a low voltage transistor region) and an EDMOS region. The opened regions of semiconductor substrate 300 can then be etched, thereby forming second trenches T2. Second trench T2 can be a region in which a device isolation film is formed in order to separate an EDMOS forming region and other regions, which can be formed by anisotropically etching a portion of semiconductor substrate 300.

Figure 3D:
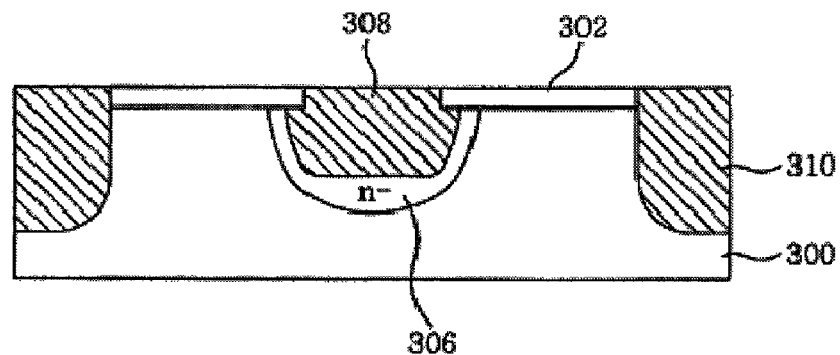

As illustrated in example FIG. 3D, first device isolation film 308 and second device isolation film 310 can then be formed by depositing an insulating film so as to completely bury the first trench T1 and second trenches T2 and then carrying out a planarization process in which pad insulating film 302 is used as a polishing start point. The device isolation insulating film can be formed as an $O_3$ TEOS film. The planarization process can be a CMP process.

Figure 3E:
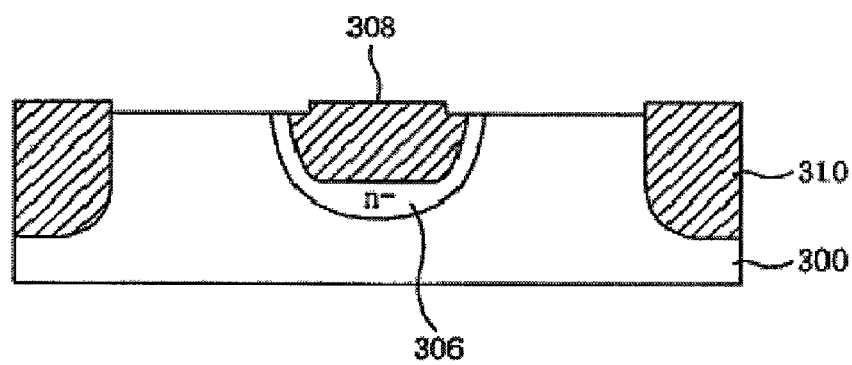

As illustrated in example FIG. 3E, pad insulating film 302 can then be removed by carrying out a wet etching process such as by using phosphoric acid ($H_3PO_4$).

Figure 3F:
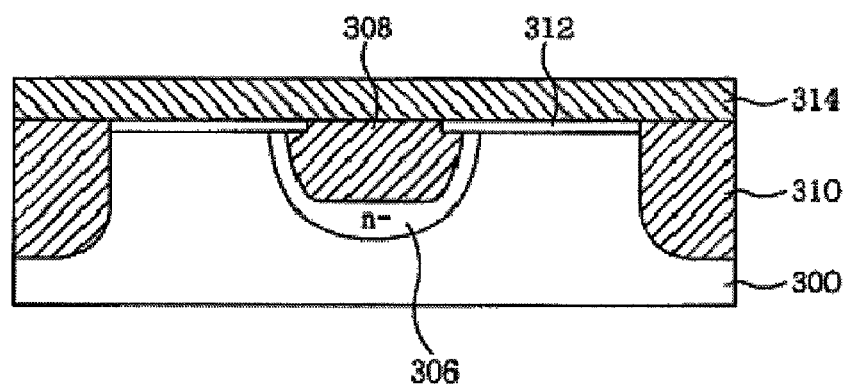

As illustrated in example FIG. 3F, gate insulating film 312 can then be formed on and/or over semiconductor substrate 300 by an oxidation process such as a dry or wet oxidation process. Conductive film 314 for a gate electrode can then be formed on and/or over gate insulating film 312. Conductive film 314 can be formed of an undoped or doped polysilicon film. The undoped silicon film can be formed by using $SiH_4$ or $Si_2H_6$ by an LPCVD method. The doped silicon film is formed by using $SiH_4$ and $PH_3$ or $Si_2H_6$ and $PH_3$ by an LPCVD method.

Figure 3G:
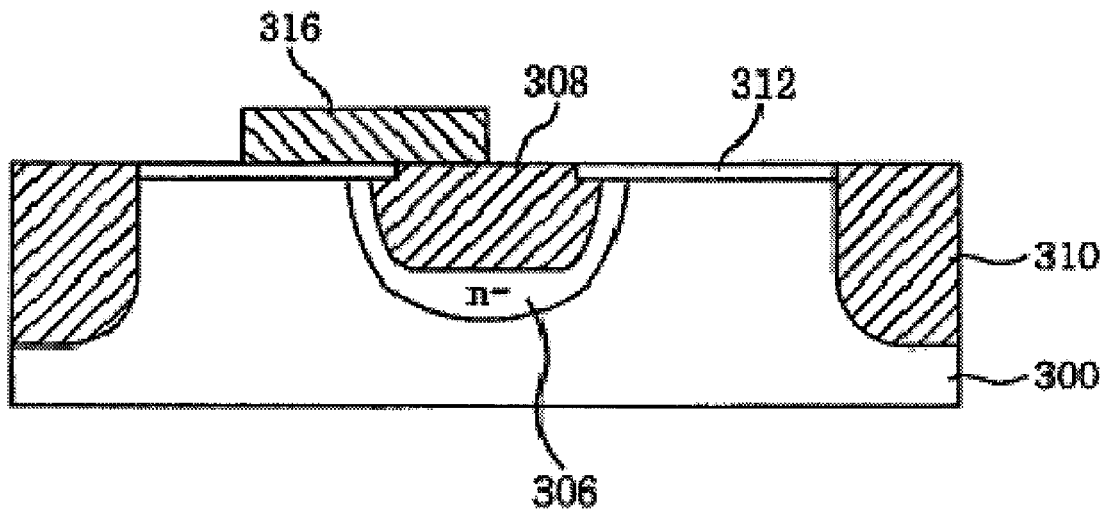

As illustrated in example FIG. 3G, a photoresist pattern can then be formed on and/or over conductive film 314 by carrying out a mask process for defining a gate electrode. Gate electrode 316 can then be formed by etching conductive film 314 by carrying out an RIE process. Gate electrode 316 can be formed so as to be overlapped with a portion of first device isolation film 308 and gate insulating film 312.

Figure 3H:
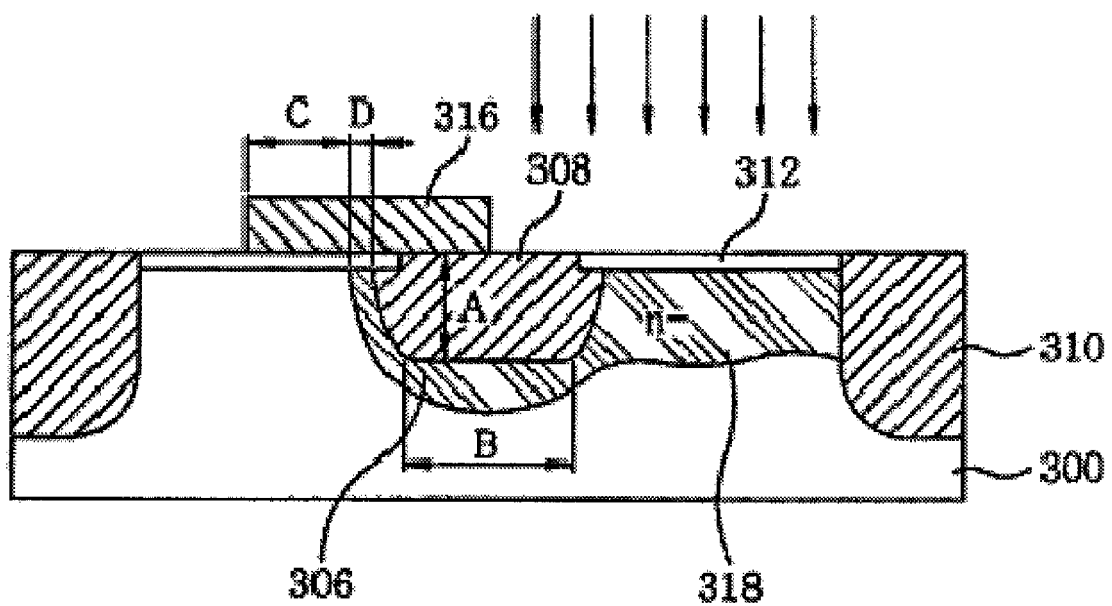

As illustrated in example FIG. 3H, the photoresist pattern can then be removed by a strip process. A second ion implantation process can then be carried out onto a region which is opened by gate electrode 316 and includes first device isolation film 308, thereby forming second n⁻ drift 318 connected to first n⁻ drift 306 and completing the drift. In the second ion implantation process, no ions are implanted in semiconductor substrate 300 below first device isolation film 308. The first and second ion implantation processes can preferably be carried out under the same process condition.

The size B of a channel operating at a high voltage, the size C of a channel region operating in a low voltage region, and the size D from the starting point of a drift region to the bird's beak of a device isolation film can be adjusted because it is possible to form first device isolation film 308 of a desired size by forming first device isolation film 308 of a STI type by etching a portion of semiconductor substrate 300.

In accordance with embodiments, it is possible to form a drift having a uniform doping concentration because a portion of first n⁻ drift 306 can be formed in semiconductor substrate 300 corresponding to first device isolation film 308 by a first ion implantation process and second n⁻ drift 318 can be formed in other regions of semiconductor substrate 300 by a second ion implantation process after formation of gate electrode 316.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming a high voltage drift of a semiconductor device comprising:
   forming a pad insulating film on a semiconductor substrate having a high voltage well; and then
   opening a region of the semiconductor substrate by patterning a portion of the pad insulating film; and then
   etching the opened region of the semiconductor substrate to form a trench; and then
   forming a first drift in the semiconductor substrate by performing a first ion implantation process using the patterned pad insulating film as a mask; and then
   forming a device isolation film by gap-filling a device isolation material in the trench; and then
   removing the patterned pad insulating film and then forming a gate electrode overlapping a portion of the device isolation film; and then
   forming a second drift connected to the first drift by performing a second ion implantation process in a region of the semiconductor substrate exposed by the gate electrode.

2. The method of claim 1, wherein the first and second ion implantation processes are performed under the same process condition.

3. The method of claim 2, wherein the trench is formed by isotropic etching.

4. The method of claim 1, wherein a depth of the trench is determined depending on a driving voltage of the semiconductor device.

5. The method of claim 1, wherein the pad insulating film is formed using SiN.

6. The method of claim 1, wherein the device isolation film is formed using a $O_3$ TEOS film.

7. The method of claim 1, wherein the gate electrode is formed using a conductive film.

8. The method of claim 7, wherein the conductive film is formed of one of an undoped and a doped polysilicon film.

9. The method of claim 8, wherein the undoped polysilicon film is formed using one of $SiH_4$ and $Si_2H_6$ by an LPCVD method.

10. The method of claim 8, wherein the doped polysilicon silicon film is formed using one of $SiH_4$, $Si_2H_6$ and $PH_3$ by an LPCVD method.

11. A method for forming high voltage drift of a semiconductor device comprising:
    forming a pad insulating film on a semiconductor substrate having a high voltage transistor region and a logic region; and then
    opening a region of the semiconductor substrate by patterning a portion of the pad insulating film; and then
    etching the opened region of the semiconductor substrate and then forming a first trench; and then forming a first drift in the semiconductor substrate by performing a first ion implantation process using the patterned pad insulating film as a mask; and then forming a second trench by etching a portion of the semiconductor substrate in order to separate the high voltage transistor region and the logic region; and then forming first and second device isolation films by gap-filling a device isolation material in the first and second trenches; and then removing the patterned pad insulating film and then forming a gate electrode overlapping a portion of the first device isolation film; and then forming a second drift connected to the first drift by performing a second ion implantation process in a region of the semiconductor substrate exposed by the gate electrode.

12. The method of claim 11, wherein the first and second ion implantation processes are performed under the same process condition.

13. The method of claim 11, wherein the first trench is formed by an isotropic etching process.

14. The method of claim 11, wherein the second trench is formed by an anisotropic etching process.

15. The method of claim 11, wherein a depth of the first trench is determined depending on a driving voltage of the high voltage transistor.

* * * * *